United States Patent
Kato et al.

(10) Patent No.: US 7,785,766 B2
(45) Date of Patent: Aug. 31, 2010

(54) SILPHENYLENE-BEARING POLYMER, PHOTO-CURABLE RESIN COMPOSITION, PATTERNING PROCESS, AND SUBSTRATE CIRCUIT PROTECTIVE FILM

(75) Inventors: Hideto Kato, Joetsu (JP); Satoshi Asai, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 424 days.

(21) Appl. No.: 12/022,685

(22) Filed: Jan. 30, 2008

(65) Prior Publication Data

US 2008/0182087 A1 Jul. 31, 2008

(30) Foreign Application Priority Data

Jan. 31, 2007 (JP) ............................. 2007-021023

(51) Int. Cl.
*G03F 7/038* (2006.01)
*G03F 7/20* (2006.01)
*G03F 7/30* (2006.01)
*G03F 7/40* (2006.01)
*C08G 77/52* (2006.01)

(52) U.S. Cl. ................. 430/270.1; 430/280.1; 430/325; 430/330; 430/905; 430/914; 528/29; 528/31; 528/33; 528/43

(58) Field of Classification Search ........................ None
See application file for complete search history.

(56) References Cited

U.S. PATENT DOCUMENTS

| | | | |
|---|---|---|---|
| 3,957,512 A | 5/1976 | Kleeberg et al. | |
| 4,243,743 A | 1/1981 | Hiramoto et al. | |
| 4,395,482 A | 7/1983 | Ahne et al. | |
| 4,990,546 A | 2/1991 | Eckberg | |
| 5,288,588 A | 2/1994 | Yukawa et al. | |
| 6,001,534 A | 12/1999 | Kato | |
| 6,072,016 A | 6/2000 | Kobayashi et al. | |
| 6,590,010 B2 | 7/2003 | Kato et al. | |

FOREIGN PATENT DOCUMENTS

| | | | |
|---|---|---|---|
| JP | 49-115541 A | | 11/1974 |
| JP | 54-145794 A | | 11/1979 |
| JP | 55-045746 A | | 3/1980 |
| JP | 56-27140 A | | 3/1981 |
| JP | 1-46862 B2 | | 10/1989 |
| JP | 3-209478 A | | 9/1991 |
| JP | 10-265571 A | | 10/1998 |
| JP | 10-274850 A | | 10/1998 |
| JP | 11-065107 A | | 3/1999 |
| JP | 2000-44668 | * | 2/2000 |
| JP | 2002-88158 A | | 3/2002 |
| JP | 2002-293877 A | | 10/2002 |

OTHER PUBLICATIONS

JPO English abstract for JP2000-44668.*
European Search Report dated Oct. 22, 2008 issued in corresponding European Application No. 08250362.4.

* cited by examiner

*Primary Examiner*—Sin J. Lee
(74) *Attorney, Agent, or Firm*—Westerman, Hattori, Daniels & Adrian, LLP

(57) ABSTRACT

A photo-curable resin composition comprising a silphenylene-bearing polymer having a Mw of 3,000-500,000 can be processed to form patterned films having a widely varying thickness from submicron to more than 20 μm. The cured films have good adhesion to substrates, heat resistance, electrical insulation and chemical resistance.

4 Claims, No Drawings

SILPHENYLENE-BEARING POLYMER, PHOTO-CURABLE RESIN COMPOSITION, PATTERNING PROCESS, AND SUBSTRATE CIRCUIT PROTECTIVE FILM

CROSS-REFERENCE TO RELATED APPLICATION

This non-provisional application claims priority under 35 U.S.C. §119(a) on Patent Application No. 2007-021023 filed in Japan on Jan. 31, 2007, the entire contents of which are hereby incorporated by reference.

TECHNICAL FIELD

This invention relates to novel silphenylene structure-bearing polymers, often referred to as silphenylene-bearing polymers, photo-curable resin compositions comprising the polymers, a patterning process, and coatings of the compositions for the protection of substrates, circuits and interconnections. In particular, due to their combination of heat resistance, chemical resistance, insulation and flexibility, the protective coatings are suited as protective dielectric films for semiconductor devices, re-wiring dielectric films for semiconductor devices, dielectric films for multilayer printed wiring boards, solder protective films, coverlay films, and substrate bonding films.

BACKGROUND ART

Prior art photosensitive protective films for semiconductor devices and dielectric films for multilayer printed boards utilize photosensitive polyimide, epoxy and silicone resins. For example, the photosensitive polyimide materials include those materials derived from polyamic acid as a polyimide precursor, typically those derived from polyamic acid by incorporating photosensitive radicals into carboxyl radicals thereon via ester bonds, as described in JP-A 49-115541 and JP-A 55-45746, and compositions comprising a polyamic acid and an amine compound having a photosensitive radical, as described in JP-A 54-145794. In these approaches, after a patterned coating is formed, imidization treatment must be effected at high temperatures above 300° C. in order to produce the desired polyimide film. This gives rise to the problems that the underlying substrate is limited by the requirement to withstand high temperatures, and interconnecting copper can be oxidized.

One solution to these problems is found in JP-A 10-274850, JP-A 10-265571, and JP-A 13-335619, which describe photosensitive polyimide materials comprising solvent-soluble resins which have been imidized, for the purpose of lowering the post-curing temperature. Since the resins in these patents are rendered photosensitive by incorporating (meth)acrylic radicals, they are susceptible to oxygen interference due to their photo-curing mechanism and also susceptible to film slimming during development. It is thus difficult to improve resolution. These materials do not meet all of the required properties.

Also proposed are positive compositions comprising a polyimide structure having phenolic hydroxyl radicals (JP-A 3-209478) or a polyamide structure (JP-B 1-46862 and JP-A 11-65107), combined with diazonaphthoquinone. These compositions suffer from the issues that their light transmittance makes it difficult to form thick films in excess of 10 microns and that the resin exerts little of its inherent curing characteristics because the resin must have a reduced molecular weight in order to ensure effective development and the amount of diazonaphthoquinone added as a sensitizer is large relative to the resin.

JP-A 2002-293877 discloses a photosensitive epoxy composition based on the reaction product of an epoxy compound with an unsaturated radical-containing carboxylic acid. The material derived from the epoxy compound can be cured at relatively low temperatures below 200° C., but the cured coating lacks flexibility and moisture-resistant adhesion and cannot be used in the application where high reliability is required.

Another known photosensitive material useful for the protection of substrates and circuits is a photosensitive silicone composition described in U.S. Pat. No. 6,590,010 or JP-A 2002-88158. The composition is curable at low temperatures below 250° C. and forms a film having reliability as typified by moisture-resistant adhesion, but has some drawbacks including insufficient chemical resistance to photoresist strippers having a high dissolving power such as N-methyl-2-pyrrolidone.

DISCLOSURE OF THE INVENTION

An object of the invention is to provide a novel silphenylene structure-bearing polymer and a photo-curable resin composition comprising the polymer, which enables to form a thick film having a thickness in excess of 20 μm so that the film may be provided with a fine feature size pattern and then heat treated at relatively low temperatures around 200° C. into a patterned film having improved characteristics and reliability as a protective film. Another object is to provide a patterning process using the composition and a coating of the composition for the protection of substrate circuits.

The inventors have found that a photo-curable resin composition comprising a silphenylene-bearing polymer comprising recurring units of the general formula (1), defined below, and having a weight average molecular weight of 3,000 to 500,000 can be processed to form films having a widely varying thickness including thin films of submicron thickness and thick films having a thickness in excess of 20 μm, using radiation in a wide range of wavelength, and specifically to form films having a fine feature size pattern by the patterning process to be described below. The cured films obtained from the photo-curable resin composition and the patterning process have good adhesion to substrates, heat resistance, electrical insulation and chemical resistance.

In one aspect, the invention provides a silphenylene structure-bearing polymer comprising recurring units of the general formula (1) and having a weight average molecular weight of 3,000 to 500,000.

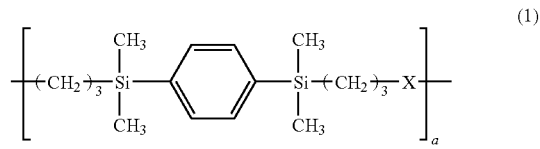

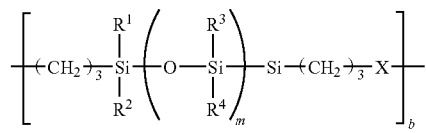

In formula (1), $R^1$ to $R^4$ are each independently a monovalent hydrocarbon radical having 1 to 8 carbon atoms, m is an integer of 1 to 100, "a" is a positive number, "b" is 0 or a positive number satisfying $0.5 \leq a/(a+b) \leq 1.0$, and X is a divalent organic radical of the general formula (2).

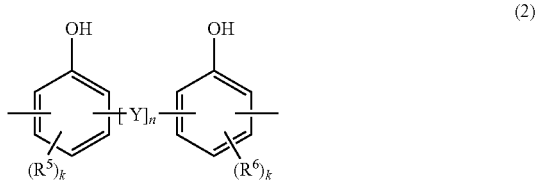

(2)

In formula (2), Y is a divalent organic radical selected from the following radicals:

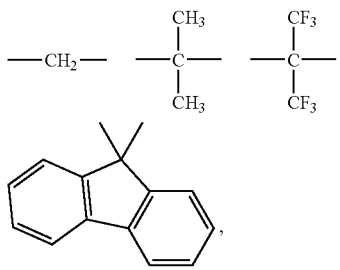

n is 0 or 1, $R^5$ and $R^6$ are each independently an alkyl or alkoxy radical having 1 to 4 carbon atoms, and k is 0, 1 or 2.

In another aspect, the invention provides a photo-curable resin composition comprising (A) the silphenylene structure-bearing polymer of formula (1), (B) at least one compound selected from the group consisting of an amino condensate modified with formalin or formalin-alcohol, a phenol compound having on the average at least two methylol or alkoxymethylol radicals in the molecule, and an epoxy compound having on the average at least two epoxy radicals in the molecule, and (C) a photoacid generator which is decomposed with radiation of 190 to 500 nm to generate an acid.

In a further aspect, the invention provides a process for forming a pattern comprising (i) using the photo-curable resin composition defined above or a solution thereof in an organic solvent to form a coating of the composition on a substrate, (ii) exposing the coating to radiation of 190 to 500 nm through a photomask, and (iii) effecting optional post-exposure heat treatment and developing the coating with a developer.

In a still further aspect, the invention provides a coating for protecting substrate circuits, obtained by post-curing at a temperature of 100 to 250° C. the patterned coating resulting from the above-described process.

BENEFITS OF THE INVENTION

The photo-curable resin composition comprising a silphenylene-bearing polymer according to the invention can form films having a widely varying thickness including thin films having a thickness of less than 1 µm and thick films having a thickness in excess of 20 µm, which can be provided with a fine feature size pattern using radiation in a wide range of wavelength. After being patterned with radiation, the films are heat treated at relatively low temperatures at or below 250° C. into patterned films having good characteristics including adhesion to substrates for use in electronic components, semiconductor devices and circuit boards, mechanical characteristics, and electrical insulation. The films are suited as protective films, dielectric films, and adhesive films for use in electrical and electronic components, circuit boards, semiconductor devices, display devices, and the like.

DESCRIPTION OF THE PREFERRED EMBODIMENT

One embodiment of the invention relates to a silphenylene-bearing polymer comprising recurring units of the general formula (1) and having a weight average molecular weight of 3,000 to 500,000.

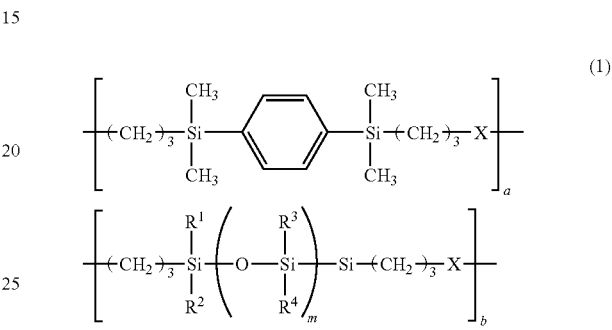

(1)

Herein each of $R^1$ to $R^4$, which may be the same or different, stands for a monovalent hydrocarbon radical having 1 to 8 carbon atoms, and preferably 1 to 6 carbon atoms. Examples include straight, branched or cyclic alkyl radicals such as methyl, ethyl, propyl, isopropyl, n-butyl, tert-butyl, and cyclohexyl, straight, branched or cyclic alkenyl radicals such as vinyl, allyl, propenyl, butenyl, hexenyl, and cyclohexenyl, aryl radicals such as phenyl and tolyl, and aralkyl radicals such as benzyl and phenylethyl.

The subscript m is an integer of 1 to 100, and preferably 1 to 80. If m is more than 100, the polymer may become less compatible with amino condensates modified with formalin or formalin-alcohol or epoxy compounds and photoacid generators, to be described later, and less photo-curable. The subscript "a" is a positive number, "b" is 0 or a positive number, and they satisfy $0.5 \leq a/(a+b) \leq 1.0$, and preferably $0.6 \leq a/(a+b) \leq 1.0$. X is a divalent organic radical, specifically a divalent aromatic radical having phenolic hydroxyl radicals represented by the general formula (2).

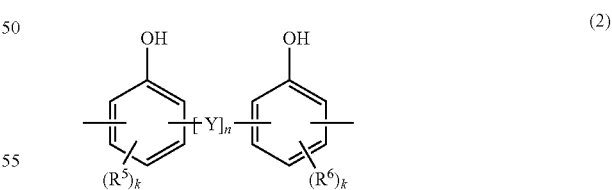

(2)

In formula (2), Y is a divalent organic radical selected from the following radicals.

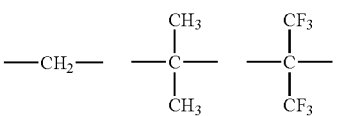

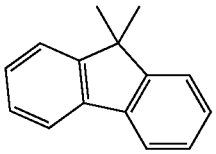

In formula (2), n is 0 or 1, each of $R^5$ and $R^6$, which may be the same or different, is an alkyl or alkoxy radical having 1 to 4 carbon atoms, and k is 0, 1 or 2. Examples of $R^5$ and $R^6$ include methyl, ethyl, isopropyl, and tert-butyl.

The silphenylene-bearing polymer should have a weight average molecular weight (Mw) of 3,000 to 500,000 and preferably 5,000 to 300,000, as determined by gel permeation chromatography (GPC) versus polystyrene standards. If Mw is less than 3,000, the polymer may become less photo-curable and a cured composition using the polymer may have insufficient mechanical characteristics. If Mw is more than 500,000, the polymer may become less compatible with amino condensates modified with formalin or formalin-alcohol, phenolic resins or epoxy compounds and photoacid generators, to be described later.

The silphenylene-bearing polymer may be prepared through polymerization reaction, known as "hydrosilylation," of hydrogensilphenylene (or 1,4-bis(dimethylsilyl)benzene) of the formula (3) and optionally a dihydroorganosiloxane of the formula (4) with a diallyl phenol compound of the formula (5) in the presence of a catalyst.

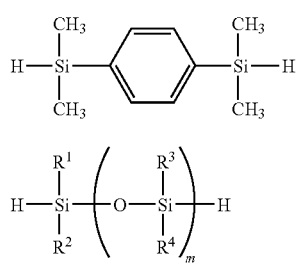

Herein, $R^1$ to $R^4$ and m are as defined above.

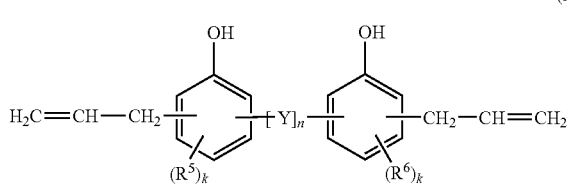

Herein, Y, $R^5$, $R^6$, n and k are as defined above.

It is understood that the weight average molecular weight of the silphenylene-bearing polymer comprising recurring units of formula (1) can be easily controlled by adjusting a ratio of the total number of allyl radicals on the diallylphenol compound of formula (5) to the total number of hydrosilyl radicals on the hydrogensilphenylene of formula (3) and optional dihydroorganosiloxane of formula (4) (i.e., total allyl radicals/total hydrosilyl radicals). Alternatively, a polymer having the desired molecular weight may be produced by effecting polymerization of the diallylphenol compound with the hydrogensilphenylene and optional dihydroorganosiloxane while using a monoallyl compound (e.g., o-allylphenol), a monohydrosilane (e.g., triethylhydrosilane) or monohydrosiloxane as a molecular weight modifier.

The catalysts which can be used in the polymerization reaction include platinum group metal elements such as platinum (inclusive of platinum black), rhodium and palladium; platinum chloride, chloroplatinic acid and chloroplatinic acid salts such as $H_2PtCl_4.xH_2O$, $H_2PtCl_6.xH_2O$, $NaHPtCl_6.xH_2O$, $KHPtCl_6.xH_2O$, $Na_2PtCl_6.xH_2O$, $K_2PtCl_4.xH_2O$, $PtCl_4.xH_2O$, $PtCl_2$, and $Na_2HPtCl_4.xH_2O$ wherein x is specifically an integer of 0 to 6, more specifically 0 or 6; alcohol-modified chloroplatinic acid as described in U.S. Pat. No. 3,220,972; complexes of chloroplatinic acid with olefins as described in U.S. Pat. Nos. 3,159,601, 3,159,662 and 3,775,452; platinum group metals such as platinum black and palladium on supports such as alumina, silica and carbon; rhodium-olefin complexes; chlorotris(triphenylphosphine)rhodium, known as Wilkinson catalyst; and complexes of platinum chloride, chloroplatinic acid or chloroplatinic acid salts with vinyl-containing siloxanes (specifically, vinyl-containing cyclic siloxanes).

If desired, an organic solvent may be used in the polymerization reaction. Suitable organic solvents include hydrocarbon organic solvents such as toluene and xylene.

With respect to polymerization conditions, the polymerization temperature is preferably in the range of 40 to 150° C., and more preferably 80 to 120° C. At too low temperatures, too long a time may be necessary until the completion of polymerization. Too high temperatures can deactivate the catalyst.

The polymerization time may vary with the type and amount of a desired polymer. Preferably polymerization is completed within about 0.5 to 10 hours, and more preferably about 0.5 to 5 hours, in order to prevent moisture entry into the polymerization system. At the end of polymerization, the solvent is distilled off if the solvent is used. In this way, a silphenylene-bearing polymer comprising recurring units of formula (1) is obtained.

The second embodiment of the invention relates to a photocurable resin composition comprising (A) a silphenylene-bearing polymer comprising recurring units of formula (1), (B) at least one compound selected from among amino condensates modified with formalin or formalin-alcohol, phenol compounds having on the average at least two methylol or alkoxymethylol radicals in the molecule, and epoxy compounds having on the average at least two epoxy radicals in the molecule, and (C) a photoacid generator which is decomposed with radiation of 190 to 500 nm to generate an acid.

Component (B) induces curing reaction with component (A) for facilitating pattern formation and augmenting the strength of a cured product. The resin used as component (B) should preferably have a weight average molecular weight (Mw) of about 150 to 10,000, and more preferably about 200 to 3,000. A resin with Mw of less than 150 may fail to provide a sufficient photo-cure ability whereas a resin with Mw in excess of 10,000 may adversely affect the heat resistance of the cured composition.

The amino condensates modified with formalin or formalin-alcohol as component (B) include melamine condensates modified with formalin or formalin-alcohol, and urea condensates modified with formalin or formalin-alcohol.

The modified melamine condensates are prepared, for example, by modifying a melamine monomer with formalin into a methylol form in a well-known manner, and optionally, further modifying it with an alcohol into an alkoxy form, thereby yielding a modified melamine of the formula (6) shown below. The alcohols used herein are lower alcohols, for example, alcohols having 1 to 4 carbon atoms.

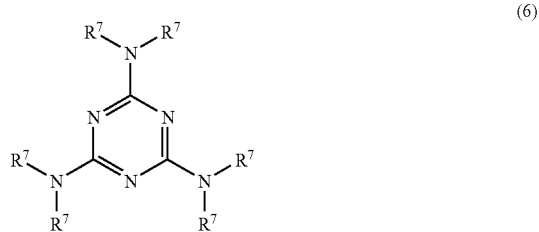

(6)

Herein, $R^7$, which may be the same or different, is a methylol radical, an alkoxymethyl radical containing an alkoxy portion of 1 to 4 carbon atoms, or hydrogen, and at least one $R^7$ is a methylol or alkoxymethyl radical. Specifically, $R^7$ is a methylol radical, an alkoxymethyl radical such as methoxymethyl or ethoxymethyl, or hydrogen.

Illustrative, non-limiting, examples of the modified melamine of formula (6) include trimethoxymethylmonomethylolmelamine, dimethoxymethylmonomethylolmelamine, trimethylolmelamine, hexamethylolmelamine, and hexamethoxymethylolmelamine.

Next, the modified melamine of formula (6) or an oligomer thereof (e.g., dimer or trimer) is subjected to addition condensation polymerization with formaldehyde in a customary way until a desired molecular weight is reached, thereby obtaining the formalin or formalin-alcohol-modified melamine condensate as component (B). One or more modified melamine condensates including monomers of formula (6) and oligomers thereof may be used as component (B).

Also, the urea condensates modified with formalin or formalin-alcohol are prepared, for example, by modifying a urea condensate having a desired molecular weight with formalin into a methylol form in a well-known manner, and optionally, further modifying it with an alcohol into an alkoxy form.

Illustrative examples of the modified urea condensate include methoxymethylated urea condensates, ethoxymethylated urea condensates, and propoxymethylated urea condensates. One or more modified urea condensates may be used as component (B).

Another component (B) is a phenol compound having on the average at least two methylol or alkoxymethylol radicals in a molecule, examples of which include (2-hydroxy-5-methyl)-1,3-benzenedimethanol and 2,2',6,6'-tetramethoxymethylbisphenol A.

A further component (B) is an epoxy compound having on the average at least two epoxy radicals in a molecule, examples of which include bisphenol type epoxy resins such as bisphenol A type epoxy resins and bisphenol F type epoxy resins, novolac type epoxy resins such as phenol novolac type epoxy resins and cresol novolac type epoxy resins, triphenolalkane type epoxy resins and polymers thereof, biphenyl type epoxy resins, dicyclopentadiene-modified phenol novolac type epoxy resins, phenolaralkyl type epoxy resins, biphenylaralkyl type epoxy resins, naphthalene ring-containing epoxy resins, glycidyl ester type epoxy resins, alicyclic epoxy resins, and heterocyclic epoxy resins.

As component (B), the amino condensates, phenol compounds and epoxy compounds may be used alone or in admixture of any.

An appropriate amount of the amino condensate, phenol compound or epoxy compound used as component (B) is 0.5 to 50 parts, and especially 1 to 30 parts by weight per 100 parts by weight of the silphenylene-bearing polymer (A). Less than 0.5 part of component (B) may fail to provide a satisfactory cure ability upon light exposure whereas more than 50 parts of component (B) may lead to a lower proportion of the silphenylene-bearing polymer in the photo-curable resin composition, which cures into a product with least of the desired effects.

The photoacid generator (C) is typically a compound which generates an acid upon exposure to light with a wavelength of 190 to 500 nm, the acid generated serving as a curing catalyst. Since the resin composition of the invention is highly compatible with the photoacid generator, the photoacid generator may be selected from a wide variety of such compounds. Typical photoacid generators include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

Exemplary onium salts are compounds of the following general formula (7).

(7)

In the formula, $R^8$ is a straight, branched or cyclic alkyl radical of 1 to 12 carbon atoms, an aryl radical of 6 to 12 carbon atoms, or an aralkyl radical of 7 to 12 carbon atoms, which may have a substituent; $M^+$ is iodonium or sulfonium; $K^-$ is a non-nucleophilic counter-ion; and the letter h is 2 or 3.

Illustrative examples of alkyl radicals represented by $R^8$ include methyl, ethyl, propyl, butyl, cyclohexyl, 2-oxocyclohexyl, norbornyl, and adamantyl. Exemplary aryl radicals include phenyl; alkoxyphenyl radicals such as o-, m- or p-methoxyphenyl, ethoxyphenyl, m- or p-tert-butoxyphenyl; and alkylphenyl radicals such as 2-, 3- or 4-methylphenyl, ethylphenyl, 4-tert-butylphenyl, 4-butylphenyl, and dimethylphenyl. Exemplary aralkyl radicals include benzyl and phenethyl.

Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Exemplary diazomethane derivatives are compounds of the following general formula (8).

(8)

In the formula, $R^9$ which may be the same or different, is a straight, branched or cyclic alkyl or halogenated alkyl radical of 1 to 12 carbon atoms, aryl or halogenated aryl radical of 6 to 12 carbon atoms, or aralkyl radical of 7 to 12 carbon atoms.

Illustrative examples of alkyl radicals represented by $R^9$ include methyl, ethyl, propyl, butyl, amyl, cyclopentyl, cyclohexyl, norbornyl, and adamantyl. Exemplary halogenated alkyl radicals include trifluoromethyl, 1,1,1-trifluoroethyl, 1,1,1-trichloroethyl, and nonafluorobutyl. Exemplary aryl radicals include phenyl; alkoxyphenyl radicals such as o-, m- or p-methoxyphenyl, ethoxyphenyl, m- or p-tert-butoxyphenyl; and alkylphenyl radicals such as 2-, 3- or 4-methylphenyl, ethylphenyl, 4-tert-butylphenyl, 4-butylphenyl, and dimethylphenyl. Exemplary halogenated aryl radicals include fluorobenzene, chlorobenzene, and 1,2,3,4,5-pentafluorobenzene. Exemplary aralkyl radicals include benzyl and phenethyl.

Illustrative examples of the photoacid generator (C) include:

onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
bis(4-tert-butylphenyl)iodonium hexafluorophosphate and diphenyl(4-thiophenoxyphenyl)sulfonium hexafluoroantimonate;

diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;

glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;

oxime sulfonate derivatives such as
α-(benzenesulfoniumoxyimino)-4-methylphenylacetonitrile;

β-ketosulfone derivatives such as
2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as
2,6-dinitrobenzyl p-toluenesulfonate and
2,4-dinitrobenzyl p-toluenesulfonate;

sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and imido-yl sulfonate derivatives such as
phthalimidoyl triflate, phthalimidoyl tosylate,
5-norbornene-2,3-dicarboxyimidoyl triflate,
5-norbornene-2,3-dicarboxyimidoyl tosylate,
5-norbornene-2,3-dicarboxyimidoyl n-butylsulfonate, and
n-trifluoromethylsulfonyloxynaphthylimide.

Also included are iminosulfonates such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile, as well as 2-methyl-2-[(4-methylphenyl)sulfonyl]-1-[(4-methylthio)phenyl]-1-propane.

Among others, imido-yl sulfonates, imino sulfonates and oxime sulfonates are preferred.

The photoacid generators (C) may be used alone or in admixture of two or more. The photoacid generator (C) is preferably added in an amount of about 0.05 to 20 parts by weight, and especially about 0.2 to 5 parts by weight, per 100 parts by weight of the silphenylene-bearing polymer (A). Less than 0.05 part of the photoacid generator may fail to provide a satisfactory photo-cure ability whereas more than 20 parts of the photoacid generator can exacerbate the photo-curing of a thick film due to the light absorption of the photoacid generator itself.

An organic solvent (D) may be blended in the photo-curable resin composition of the invention, if necessary. The organic solvent used herein may be any organic solvent in which the polymer (A), component (B) and photoacid generator (C) and other components are soluble.

Illustrative, non-limiting, examples of the organic solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more thereof.

Of these solvents, preferred are ethyl lactate, cyclohexanone, cyclopentanone, propylene glycol monomethyl ether acetate, γ-butyrolactone, and mixtures thereof, in which the photoacid generator is most soluble.

An appropriate amount of the organic solvent (D) used is about 50 to 2,000 parts, and especially about 100 to 1,000 parts by weight per 100 parts by weight of all solids available from components (A) to (C). With less than 50 parts of the organic solvent, components (A) to (C) may become insufficiently compatible. With more than 2,000 parts of the organic solvent, little further improvement is made in compatibility and the composition having a too low viscosity may become difficult to apply.

In addition to the aforementioned components, the photo-curable resin composition of the invention may include optional components. For example, there may be added a surfactant which is commonly used for improving the coating characteristics. Preferred are nonionic surfactants, for example, fluorochemical surfactants such as perfluoroalkyl polyoxyethylene ethanols, fluorinated alkyl esters, perfluoroalkylamine oxides, and fluorinated organosiloxane compounds.

These surfactants are commercially available. Illustrative examples include Fluorad FC-4430 from Sumitomo 3M Ltd., Surflon S-141 and S-145 from Asahi Glass Co., Ltd., Unidyne DS-401, DS-4031, and DS-451 from Daikin Industries Ltd., Megaface F-8151 from Dainippon Ink & Chemicals, Inc., and X-70-093 from Shin-Etsu Chemical Co., Ltd. Preferred surfactants include Fluorad FC-4430 from Sumitomo 3M Ltd. and X-70-093 from Shin-Etsu Chemical Co., Ltd.

Another component which can be added herein is a light absorber for improving the light absorption efficiency of the photoacid generator. Exemplary light absorbers include diaryl sulfoxides, diaryl sulfones, 9,10-dimethylanthracene and 9-fluorenone. Also, basic compounds may be added for sensitivity adjustment purpose, for example, tertiary amine compounds such as triethanol amine, and nitrogen-containing compounds such as benzotriazole and pyridine. Silane coupling agents may be added for adhesion improving purpose, for example, an epoxy-functional silane coupling agent KBM-403 (Shin-Etsu Chemical Co., Ltd.). Besides, other optional components which are commonly used in conventional resist materials can be added when the photo-curable resin composition of the invention is used as a resist. These optional components may be added in ordinary amounts so long as this does not compromise the objects of the invention.

The photo-curable resin composition of the invention is prepared in a conventional way. For example, it can be prepared by agitating and mixing the aforementioned components and optionally, organic solvent and additives and passing the mixture through a filter to remove solids, if necessary.

The photo-curable resin composition thus prepared is useful as protective films for semiconductor devices, protective films on interconnections, and coverlay films. It can also be employed as a solder resist or a photoresist material for microfabrication.

When a pattern is formed using the photo-curable resin composition, the patterning process involves the steps of (i) applying the photo-curable resin composition onto a substrate by a coating or suitable technique, to form a coating, (ii) exposing the coating to radiation having a wavelength of 190 to 500 nm through a photomask, and optionally heating the coating (known as post-exposure baking, PEB), and (iii) developing the exposed coating with a developer. After the coating is provided with a pattern through the three steps, the step (iv) of heating the patterned coating is performed for post-curing purpose, eventually yielding the desired protective film.

More particularly, the photo-curable resin composition is first applied onto a substrate. The substrates used herein include silicon wafers and plastic or ceramic circuit substrates. Alternatively, the composition or a solution thereof may be separately formed into a film, which is attached to a substrate.

The application may employ well-known techniques complying with lithography. For example, the composition is applied by dipping, spin coating and roll coating. The coverage may be determined as appropriate for a particular purpose although a coating thickness of 0.1 to 100 μm is often preferred. A coating thickness of 1 to 100 μm, and specifically 3 to 80 μm is more preferred. In the alternative procedure, the composition is previously formed into a film, which is attached to a substrate.

In order that effective photo-curing reaction take place, the solvent may be previously evaporated off by preheating, if necessary. The preheating is, for example, at about 40 to 140° C. for about 1 minute to 1 hour.

Then the coating is exposed to radiation having a wavelength of 190 to 500 nm through a photomask for effecting photo-curing reaction. The photomask used herein may be a member in which a desired pattern has been cut out. The photomask is preferably made of a material capable of shielding the radiation having a wavelength of 190 to 500 nm, for example, chromium although the photomask material is not limited thereto.

Examples of the radiation having a wavelength of 190 to 500 nm include radiation of various wavelengths generated by radiation-emitting units, for example, UV radiation (e.g., g-line and i-line) and deep UV radiation (248 nm, 198 nm). A wavelength range from 248 to 436 nm is preferred. An appropriate exposure dose is 10 to 2,000 mJ/cm$^2$, but not limited thereto. If desired for increasing the development sensitivity, the exposed coating may be heat treated. Such post-exposure heat treatment is effected, for example, at about 40 to 140° C. for about 0.5 to 10 minutes.

Following the exposure or exposure and heating, the coating is developed with a developer. The developer is preferably any of customarily used organic solvents, for example, alcohols such as isopropyl alcohol (IPA), ketones such as cyclohexanone, and glycols such as propylene glycol monomethyl ether. The solvent which may be used as the solvent for the composition can be used at the development stage. Development is effected in a conventional manner, for example, by dipping the patterned coating in the developer. The development is followed by washing, rinsing and drying if necessary. There is obtained a composition coating having the desired pattern.

Although the pattern forming process has been described, it is sometimes unnecessary to form a pattern. When it is simply desired to form a uniform film, for example, the same process as above may be followed except that the photomask is not used.

If desired, the patterned coating may be heated in an oven or hot plate at 100 to 250° C. for about 10 minutes to about 10 hours for increasing the crosslinking density and removing the residual volatile matter. Then a coating having augmented adhesion to substrates, heat resistance, high strength and good electrical properties can be formed.

Since the cured coating obtained from the photo-curable resin composition in the above-described way has improved substrate adhesion, heat resistance, electrical insulation, and mechanical properties, it can be advantageously used as a protective film on electric and electronic components and semiconductor devices. Since the coating can be provided with a fine feature size pattern and has improved substrate adhesion, electrical and mechanical properties, it can be advantageously used as semiconductor device protective films, interconnection protective films, coverlay films, solder resists and the like.

EXAMPLE

Examples of the invention are given below by way of illustration and not by way of limitation. All parts are by weight. Me stands for methyl, Ph for phenyl, and Mw for weight average molecular weight.

Synthesis Example 1

A flask equipped with a stirrer, thermometer, nitrogen purging line and reflux condenser was charged with 56.0 g of 4,4'-methylenebis[2-(2-propenyl)phenol], 140 g of toluene and 0.04 g of chloroplatinic acid and heated at 80° C. Then 38.9 g of 1,4-bis(dimethylsilyl)benzene was added dropwise to the flask over one hour. At this point, the flask interior temperature rose to 88° C. After the dropwise addition, the reaction solution was ripened for 2 hours at 80° C. Then the toluene was distilled off and instead, 90 g of cyclohexanone was added. This yielded a resin solution (A-1) in cyclohexanone having a resin solids concentration of 50%. The resin content in the solution was measured for molecular weight by GPC versus polystyrene standards, finding a Mw of 120,000. The polymer corresponds to formula (1) wherein b=0.

Synthesis Example 2

A flask equipped with a stirrer, thermometer, nitrogen purging line and reflux condenser was charged with 43.1 g of 9,9'-bis(3-allyl-4-hydroxyphenyl)fluorene, 29.5 g of an organohydrogensiloxane of the average structural formula (9):

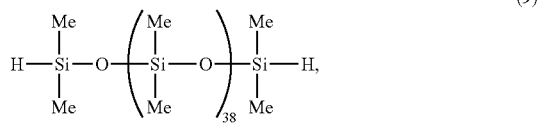

135 g of toluene and 0.04 g of chloroplatinic acid and heated at 80° C. Then 17.5 g of 1,4-bis(dimethylsilyl)benzene was added dropwise to the flask over one hour. At this point, the flask interior temperature rose to 85° C. After the dropwise addition, the reaction solution was ripened for 2 hours at 80° C. Then the toluene was distilled off and instead, 80 g of cyclohexanone was added. This yielded a resin solution (A-2) in cyclohexanone having a resin solids concentration of 50%. The resin content in the solution was measured for molecular weight by GPC versus polystyrene standards, finding a Mw of 45,000. The polymer corresponds to formula (1) wherein a/(a+b)=0.90.

Synthesis Example 3

A flask equipped with a stirrer, thermometer, nitrogen purging line and reflux condenser was charged with 61.6 g of 4,4'-(1-methylethylidene)bis[2-(2-propenyl)phenol], 175 g of toluene and 0.04 g of chloroplatinic acid and heated at 80° C. Then a mixture of 21.4 g of 1,4-bis(dimethylsilyl)benzene and 89.3 g of an organohydrogensiloxane of the average structural formula (10):

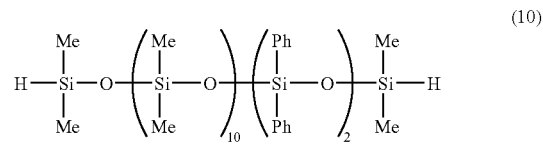

was added dropwise to the flask over one hour. At this point, the flask interior temperature rose to 88° C.

After the dropwise addition, the reaction solution was ripened for 2 hours at 80° C. Then the toluene was distilled off and instead, 170 g of propylene glycol 1-monomethyl ether 2-acetate was added. This yielded a resin solution (A-3) in propylene glycol 1-monomethyl ether 2-acetate having a resin solids concentration of 50%. The resin content in the solution was measured for molecular weight by GPC versus polystyrene standards, finding a Mw of 8,000. The polymer corresponds to formula (1) wherein a/(a+b)=0.61.

Synthesis Example 4

A flask equipped with a stirrer, thermometer, nitrogen purging line and reflux condenser was charged with 58.5 g of 4,4'-(1-methylethylidene)bis[2-(2-propenyl)phenol], 2.7 g of 2-allylphenol, 210 g of toluene and 0.04 g of chloroplatinic acid and heated at 80° C. Then a mixture of 31.2 g of 1,4-bis (dimethylsilyl)benzene and 117.9 g of the organohydrogensiloxane having formula (9) was added dropwise to the flask over one hour. At this point, the flask interior temperature rose to 88° C.

After the dropwise addition, the reaction solution was ripened for 2 hours at 80° C. Then the toluene was distilled off and instead, 200 g of propylene glycol 1-monomethyl ether 2-acetate was added. This yielded a resin solution (B-1) in propylene glycol 1-monomethyl ether 2-acetate having a resin solids concentration of 50%. The resin content in the solution was measured for molecular weight by GPC versus polystyrene standards, finding a Mw of 2,500. The polymer corresponds to formula (1) wherein a/(a+b)=0.080.

Synthesis Example 5

A flask equipped with a stirrer, thermometer, nitrogen purging line and reflux condenser was charged with 61.6 g of 4,4'-(1-methylethylidene)bis[2-(2-propenyl)phenol], 95 g of toluene and 0.04 g of chloroplatinic acid and heated at 80° C. Then a mixture of 15.6 g of 1,4-bis(dimethylsilyl)benzene and 16.1 g of 1,3-dihydro-1,1,3,3-tetramethyldisiloxane was added dropwise to the flask over one hour. At this point, the flask interior temperature rose to 86° C.

After the dropwise addition, the reaction solution was ripened for 2 hours at 80° C. Then the toluene was distilled off and instead, 90 g of propylene glycol 1-monomethyl ether 2-acetate was added. This yielded a resin solution (B-2) in propylene glycol 1-monomethyl ether 2-acetate having a resin solids concentration of 50%. The resin content in the solution was measured for molecular weight by GPC versus polystyrene standards, finding a Mw of 14,000. The polymer corresponds to formula (1) wherein a/(a+b)=0.40.

EXAMPLES AND COMPARATIVE EXAMPLES

Photo-curable resin compositions of Examples 1 to 5 and Comparative Examples 1 and 2 were prepared by combining the resin solutions synthesized in Synthesis Examples 1 to 5, with a crosslinker, a photoacid generator, a solvent and additives according to the recipe shown in Table 1, agitating and mixing them for dissolution, and precision filtering through a Teflon® filter with a pore size of 0.2 µm.

Thereafter, using a spin coater, each of the compositions was coated onto an untreated 6-inch silicon wafer to a thickness as shown in Table 1. The coated silicon substrate was heated and dried on a hot plate at 120° C. for 2 minutes for removing the solvent. Through a quartz mask having a pattern of equi-spaced lines having a width varying from 1 µm to 50 µm, the coating was exposed to radiation having a wavelength as shown in Table 1 in an exposure dose as shown in Table 1. The exposure was followed by heat treatment at 100° C. for 1 minute and cooling.

Thereafter, the coated substrate was dipped in 2-propanol for 4 minutes for development. The width of lines which could be resolved is reported in Table 1 together with the thickness of the coating as developed.

Separately, the resin compositions of Examples 1 to 5 and Comparative Examples 1 to 2 were evaluated for cured properties. Each resin composition was applied and cured to a 6-inch silicon wafer and a copper-clad substrate in which a 6-inch silicon wafer was electroplated over its entire surface with copper to a thickness of 2 µm. The resin composition was examined by the tests described below, with the results shown in Table 2.

Electrical Properties

The resin composition was evaluated for dielectric strength by diluting it with cyclohexanone to a resin solids concentration of 10%. The diluted solution was spin coated on a 6-inch silicon wafer and pre-baked for solvent removal. The coated substrate was exposed to radiation over its entire surface without using a quartz mask. The exposure was followed by heat treatment and dipping in 2-propanol. The coating left after these steps was further heated in an oven at 200° C. for 1 hour, yielding a cured film of 0.8 µm thick. The cured film was measured for dielectric strength by a CV-IV measuring system SSM600 by Solid State Measurements, Inc.

Adhesion

The resin composition was evaluated for adhesion to substrates. A solution of the resin composition was spin coated onto a silicon wafer and a copper-clad substrate and pre-baked for solvent removal. The coated substrate was exposed to radiation over its entire surface without using a quartz mask. The exposure was followed by heat treatment and dipping in 2-propanol. The coating left after these steps was further heated in an oven at 200° C. for 1 hour, yielding a cured film. The cured film was tested for moisture resistant adhesion to silicon and copper. Specifically, the wafer bearing the cured film was placed in a pressure cooker tester at 2.1 atm. and 100% RH for 96 hours, after which a cross-hatch adhesion test was carried out. The number of film sections left after peeling among 100 sections was counted.

Crack Resistance

The cured resin composition was examined for crack resistance after thermal cycling. A solution of the resin composition was spin coated onto a silicon wafer and pre-baked for solvent removal. The coated substrate was exposed to radiation through a quartz mask having an open area of 15 mm×15 mm. The exposure was followed by heat treatment and development, forming a square pattern of 15 mm×15 mm (having a varying thickness) on the wafer. The substrate was further heated at 200° C. for 1 hour, yielding a cured film of the resin composition having a size of 15 mm×15 mm. The wafer bearing the cured film was placed in a thermal cycling tester where thermal cycling between −55° C. and 150° C. was repeated until 1,000 cycles. During the test, the resin film was observed for the occurrence of cracks.

Solvent Resistance

The cured resin composition was examined for solvent resistance, specifically resistance to N-methyl-2-pyrrolidone (NMP) which is frequently used in the fabrication of semiconductor devices. As in the crack resistance test, a pattern of 15 mm×15 mm was formed on a wafer from the resin composition. The wafer bearing the cured film was immersed in NMP at room temperature for 1 hours. The resin film was examined for thickness change and outer appearance, from which solvent resistance was rated.

TABLE 1

| | | Composition component (pbw) | | | Thickness after spin coating (µm) | Light source/ Exposure dose | Thickness after development (µm) | Minimum L&S resolved (µm) |
|---|---|---|---|---|---|---|---|---|
| | | Resin solution | PAG | Cross-linker | Additives | | | |
| Example | 1 | A-1 100 pbw | PG-1 1 pbw | CL-1 5 pbw | FC-4430 0.02 pbw | 30 | NSR-1755i7A 365 nm/ 400 mJ/cm² | 29.5 | 15 |
| | 2 | A-1 100 pbw | PG-2 1 pbw | CL-2 7 pbw | FC-4430 0.02 pbw Triethanol amine 0.1 pbw | 30 | NSR-TFH1 436 nm/ 500 mJ/cm² | 29.5 | 15 |
| | 3 | A-1 100 pbw | PG-3 1 pbw | CL-3 7 pbw | X-70-093 0.02 pbw KBM-403 3 pbw Cyclohexanone 200 pbw | 2 | PLA-600FA Xe—Hg lamp 270-320 nm/ 120 mJ/cm² | 1.8 | 2 |

TABLE 1-continued

| | | Composition component (pbw) | | | | Thickness after spin coating (μm) | Light source/ Exposure dose | Thickness after development (μm) | Minimum L&S resolved (μm) |
|---|---|---|---|---|---|---|---|---|---|
| | | Resin solution | PAG | Cross-linker | Additives | | | | |
| | 4 | A-2 100 pbw | PG-1 1 pbw | CL-1 3 pbw | X-70-093 0.02 pbw KBM-403 3 pbw | 30 | NSR-1755i7A 365 nm/ 300 mJ/cm² | 29.5 | 20 |
| | 5 | A-3 100 pbw | PG-3 1 pbw | CL-4 10 pbw | X-70-093 0.02 pbw Cyclohexanone 150 pbw | 5 | PLA-600FA Xe—Hg lamp 270-320 nm/ 250 mJ/cm² | 4.7 | 3 |
| Comparative Example | 1 | B-1 100 pbw | PG-1 1 pbw | CL-1 5 pbw | X-70-093 0.02 pbw KBM-403 3 pbw | 30 | NSR-1755i7A 365 nm/ 600 mJ/cm² | 27.5 | 40 |
| | 2 | B-2 100 pbw | PG-1 1 pbw | CL-1 5 pbw | X-70-093 0.02 pbw KBM-403 3 pbw | 30 | NSR-1755i7A 365 nm/ 500 mJ/cm² | 29.0 | 20 |

Under the heading "Light source", NSR-1755i7A and NSR-TFH1 are steppers available from Nikon Corp. and PLA-600FA is a contact aligner available from Canon Inc.

The photoacid generators (PAG) used are as follows.

PG-1:

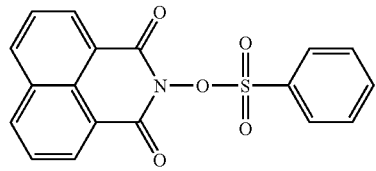

PG-2:
IRGACURE PAG103 (Ciba Specialties Chemicals)

PG-3:

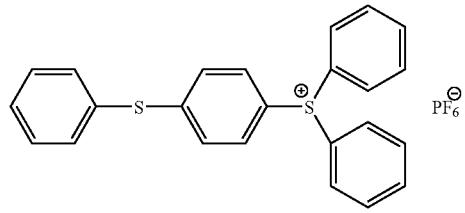

The crosslinkers used are as follows.

CL-1:

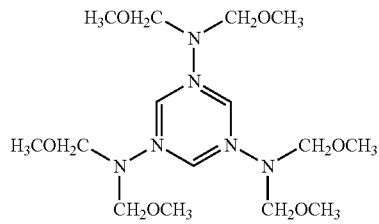

CL-2:

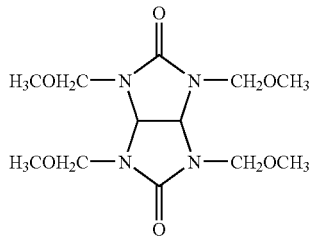

CL-3:

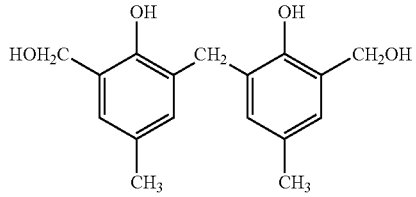

CL-4:

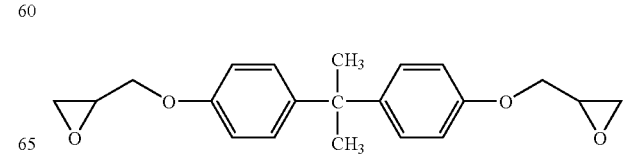

TABLE 2

| | | Dielectric strength | Adhesion Si wafer | Adhesion Copper | Crack resistance on thermal cycling | Solvent (NMP) resistance |
|---|---|---|---|---|---|---|
| Example | 1 | 400 V/μm | 100/100 | 100/100 | No cracks | Thickness and appearance unchanged |
| | 2 | 400 V/μm | 100/100 | 100/100 | No cracks | Thickness and appearance unchanged |
| | 3 | 400 V/μm | 100/100 | 100/100 | No cracks | Thickness and appearance unchanged |
| | 4 | 350 V/μm | 100/100 | 100/100 | No cracks | Thickness and appearance unchanged |
| | 5 | 350 V/μm | 100/100 | 100/100 | No cracks | Thickness and appearance unchanged |
| Comparative Example | 1 | 300 V/μm | 100/100 | 100/100 | Cracked at 600 cycles | Thickness and appearance unchanged |
| | 2 | 320 V/μm | 100/100 | 100/100 | Cracked at 800 cycles | Thickness increase by swelling |

It has been demonstrated that the compositions of Examples 1 to 5 undergo little slimming at any thickness in a wide range varying from a thin film of about 1 μm to a thick film of more than 20 μm and exhibit good resolution and satisfactory properties as a photosensitive material. Their cured films have good adhesion to various substrates, acceptable electrical properties including dielectric strength, and acceptable properties including crack resistance and solvent resistance, and are thus suited as protective films for circuits and electronic components.

Japanese Patent Application No. 2007-021023 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silphenylene structure-bearing polymer comprising recurring units of the general formula (1) and having a weight average molecular weight of 3,000 to 500,000,

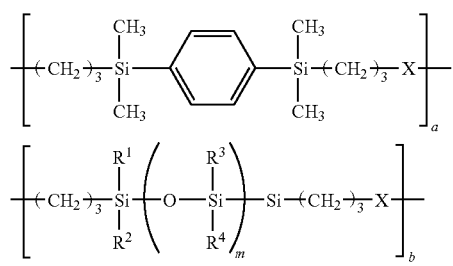

(1)

wherein $R^1$ to $R^4$ are each independently a monovalent hydrocarbon radical having 1 to 8 carbon atoms, m is an integer of 1 to 100, "a" is a positive number, "b" is 0 or a positive number satisfying $0.5 \leq a/(a+b) \leq 1.0$, X is a divalent organic radical of the general formula (2):

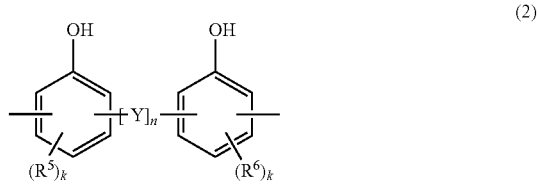

(2)

wherein Y is a divalent organic radical selected from the following radicals:

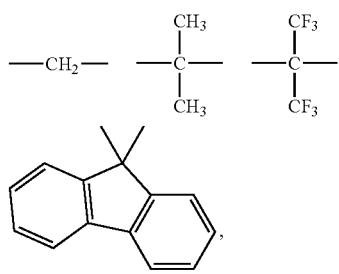

n is 0 or 1, $R^5$ and $R^6$ are each independently an alkyl or alkoxy radical having 1 to 4 carbon atoms, and k is 0, 1 or 2.

2. A photo-curable resin composition comprising
(A) the silphenylene structure-bearing polymer of claim 1,
(B) at least one compound selected from the group consisting of an amino condensate modified with formalin or formalin-alcohol, a phenol compound having on the average at least two methylol or alkoxymethylol radicals in the molecule, and an epoxy compound having on the average at least two epoxy radicals in the molecule, and
(C) a photoacid generator which is decomposed with radiation of 190 to 500 nm to generate an acid.

3. A process for forming a pattern comprising
(i) using the photo-curable resin composition of claim 2 or a solution thereof in an organic solvent to form a coating of the composition on a substrate,
(ii) exposing the coating to radiation of 190 to 500 nm through a photomask, and
(iii) effecting optional post-exposure heat treatment and developing the coating with a developer.

4. A coating for protecting substrate circuits, obtained by post-curing at a temperature of 100 to 250° C. the patterned coating resulting from the process of claim 3.

* * * * *